US011061265B2

(12) United States Patent
 Chen

(10) Patent No.: US 11,061,265 B2
(45) Date of Patent: Jul. 13, 2021

(54) COA SUBSTRATE AND DISPLAY PANEL

(71) Applicant: Shenzhen China Star Optoelectronics Semiconductor Display Technology Co., Ltd., Guangdong (CN)

(72) Inventor: Lixuan Chen, Guangdong (CN)

(73) Assignee: Shenzhen China Star Optoelectronics Semiconductor Display Technology Co., Ltd., Guangdong (CN)

( * ) Notice: Subject to any disclaimer, the term of this patent is extended or adjusted under 35 U.S.C. 154(b) by 0 days.

(21) Appl. No.: 16/627,792

(22) PCT Filed: Dec. 18, 2019

(86) PCT No.: PCT/CN2019/126242
§ 371 (c)(1),
(2) Date: Dec. 31, 2019

(65) Prior Publication Data
 US 2021/0173243 A1    Jun. 10, 2021

(30) Foreign Application Priority Data

Dec. 9, 2019 (CN) .......................... 201911253718.0

(51) Int. Cl.
 *G02F 1/1333* (2006.01)
 *G02F 1/1368* (2006.01)
 (Continued)

(52) U.S. Cl.
 CPC ...... *G02F 1/133357* (2021.01); *G02F 1/1368* (2013.01); *G02F 1/133512* (2013.01);
 (Continued)

(58) Field of Classification Search
 CPC ............. G02F 1/1368; G02F 1/133512; G02F 2001/133357; G02F 2001/136222; G02F 1/133357; G02F 1/136222
 See application file for complete search history.

(56) References Cited

U.S. PATENT DOCUMENTS

2002/0186337 A1    12/2002  Andry et al.
2005/0253984 A1*   11/2005  Kim ...................... G02F 1/1362
                                                           349/106
(Continued)

FOREIGN PATENT DOCUMENTS

CN       202735644 U     2/2013
CN       104166280 A    11/2014
(Continued)

*Primary Examiner* — Dung T Nguyen
(74) *Attorney, Agent, or Firm* — Mark M. Friedman

(57) ABSTRACT

A color-filter on array substrate, having a first base substrate, includes a plurality of thin-film transistors (TFTs) disposed in an array on the first base substrate; color resists correspondingly disposed on one of the TFTs; a planarization layer disposed on the color resists and covering all of the color resists; and an electrically conductive layer disposed on the planarization layer. An orthogonal projection of the electrically conductive layer on the planarization layer covers the planarization layer. The electrically conductive layer comprises a plurality of first regions and second regions being separated. Each of the first regions is electrically connected to one of the TFTs. One of a plurality of protrusions is provided by the planarization layer or at least one of two adjacent color resists and corresponds to one of the second regions.

5 Claims, 2 Drawing Sheets

(51) Int. Cl.
*G02F 1/1335* (2006.01)
*G02F 1/1362* (2006.01)
*H01L 27/12* (2006.01)

(52) U.S. Cl.
CPC .... *G02F 1/136222* (2021.01); *H01L 27/1244* (2013.01); *H01L 27/1248* (2013.01)

(56) References Cited

U.S. PATENT DOCUMENTS

| | | | |
|---|---|---|---|
| 2010/0188593 A1* | 7/2010 | Yamaguchi | G02F 1/136227 349/43 |
| 2015/0022768 A1* | 1/2015 | Li | G02F 1/134309 349/108 |
| 2016/0299379 A1* | 10/2016 | Sun | G02F 1/133509 |
| 2016/0370648 A1 | 12/2016 | Yao et al. | |
| 2017/0045767 A1 | 2/2017 | Xu et al. | |

FOREIGN PATENT DOCUMENTS

| | | |
|---|---|---|
| CN | 104656325 A | 5/2015 |
| CN | 104698713 A | 6/2015 |
| CN | 110018600 A | 7/2019 |
| CN | 110398863 A | 11/2019 |

\* cited by examiner

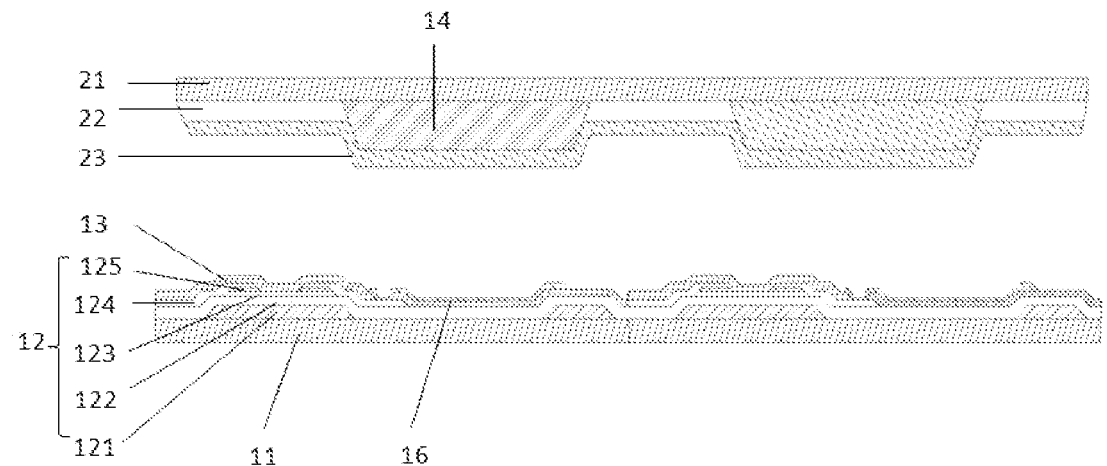
FIG. 1A, Prior Art
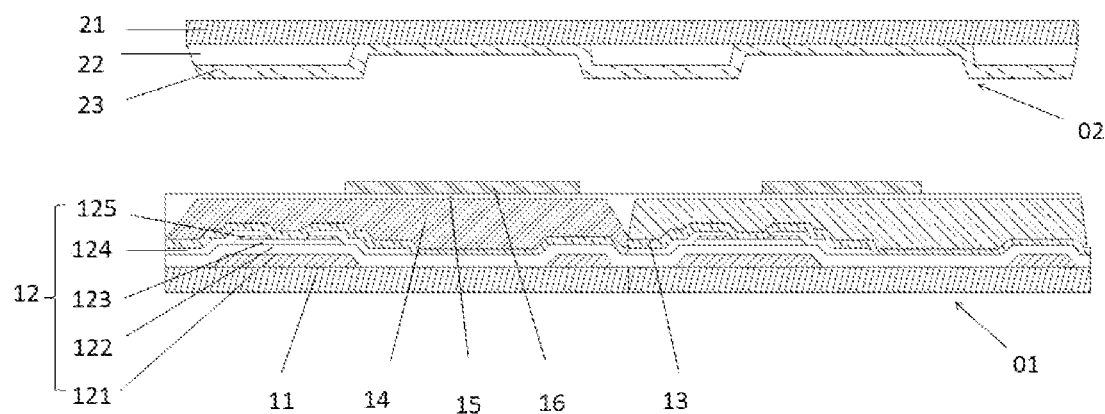
FIG. 1B, Prior Art

COA SUBSTRATE AND DISPLAY PANEL

CROSS REFERENCE TO RELATED APPLICATIONS

The present disclosure claims priority of China Patent application filed with the National Intellectual Property Administration on Dec. 10, 2019, application number is 201911253718.0 and the title is "COA Substrate and Display Panel". The content of the application is cited and incorporated in the present disclosure in its entirety.

FIELD OF INVENTION

The present disclosure relates to the field of display technologies, and more particularly, to a color-filter on array substrate and a display panel.

BACKGROUND OF INVENTION

According to liquid crystal optics theory, in the operation of vertical alignment liquid crystal (VA LCD), a transmittance is defined as $T=0.5*\sin 2(2\varphi)\sin 2(pi*\Delta nd/\lambda)$. The azimuth $\varphi$ of liquid crystals is required to be deflected to 45 degrees so that the polarization direction of the incident light is deflected by 90 degrees after passing through the liquid crystal layer to make the transmittance extremely high. Therefore, in the existing VA LCD design, the pixel electrodes are arranged at 45 degrees in the horizontal/vertical direction so that the liquid crystal molecules can be arranged in the direction of $\varphi=45$ degrees when the voltage is applied to drive the liquid crystal molecules.

In a color-filter on array (COA) liquid crystal display, a conventional pixel electrode is formed on a second passivation layer (PV2), then the pixel electrode is patterned and formed, and polyimide (PI) coating and alignment processes are performed. The second passivation layer is generally made of silicon nitride (SiN). Because silicon nitride needs to be manufactured by a chemical vapor deposition (CVD) process, only a coating process is required by the planarization layer (polymer film on array, PFA). Therefore, in the prior art, a planarization layer is often used to replace the structure of the second passivation layer on one side of the COA substrate. Now, the passivation layer of many products is changed from a silicon nitride material to a planarization layer to improve the limited capacity problem of the CVD process.

However, because the planarization layer is affected by chemical processes during synthesis, impurities and ions are easily be to left. Especially after LCD devices are manufactured, it is easy for ion precipitation to occur in the planarization layer, which causes ions to enter the liquid crystal layer and affect its resistivity and results in image sticking.

One of the reasons that the ions in the planarization layer easily enter the liquid crystal layer is that the patterned pixel electrodes on the array side generate a periodic slit angle and line/space periodic structures. The PI alignment film disposed between parts of the planarization layer and the liquid crystal layer has a weak capacity of blocking ions. On the other hand, after the PI alignment film is invaded by ions, resistivity and capacitance change so that image sticking result is affected.

A double-layer pixel electrode on a planarization layer at the array side of a COA substrate is also provided in the prior art to block ion penetration of the planarization layer. However, this technology requires regulation of the electrical properties and it adversely affects 45-degree electric field for patterning pixel electrode. Thus, the process is more complicated.

Technical Problems

The present disclosure provides a COA substrate and a display panel. An electrically conductive layer covering the planarization layer is provided on a planarization layer. The electrically conductive layer includes a plurality of first regions and second regions disposed between two adjacent first regions. Each of the first regions of the electrically conductive layer is electrically connected to a thin-film transistor. The adjacent first regions are disconnected and the second regions are separated. Segmentation separation occurs at the boundary between the electrically conductive layer and the color resists, which can make the electrically conductive layer work independently in a single pixel unit without short circuiting and can effectively prevent the planarization layer from generating ion penetration into the liquid crystal layer. Thus, the problem of image sticking is improved.

SUMMARY OF INVENTION

The present disclosure provides a color-filter on array (COA) substrate and a display panel. The electrically conductive layer covering the planarization layer is provided on the planarization layer. The electrically conductive layer includes the plurality of first regions and second regions disposed between two adjacent first regions. Each of the first regions of the electrically conductive layer is electrically connected to a thin-film transistor. The adjacent first regions are disconnected and the second region are separated. Segmentation separation occurs is at the boundary between the electrically conductive layer the color resist, which can make the electrically conductive layer work independently in a single pixel unit without short circuit and can effectively prevent the planarization layer from generating ion penetration into the liquid crystal layer. Thus, the problems of image sticking are improved.

First, the embodiment of the present disclosure provides a COA substrate, having a first base substrate, comprising: a plurality of thin-film transistors (TFTs) disposed on the first base substrate; color resists, wherein each of the color resists is correspondingly disposed on one of the TFTs; a planarization layer disposed on the color resists and covering all of the color resists; and an electrically conductive layer disposed on the planarization layer; wherein an orthogonal projection of the electrically conductive layer projecting on the planarization layer covers the planarization layer, the electrically conductive layer comprises a plurality of first regions and second regions disposed between two adjacent one of the first regions, each of the first regions is electrically connected to one of the TFTs, and the first regions and the adjacent second regions are separated; and wherein the planarization layer is provided with a plurality of first protrusions, each first protrusion is corresponding to an area of one of the second regions, or the color resists are provided with a plurality of second protrusions, at least one of two adjacent one of the color resists is provided with one of the plurality of second protrusions, and the plurality of second protrusions correspond to the plurality of first protrusions.

In the COA substrate, a surface of the first protrusion contacted with the electrically conductive layer and a surface of the first protrusion contacted with the planarization layer are formed at least one undercut structure.

In the COA substrate, a surface of the second protrusion contacted with the electrically conductive layer and a surface of the second protrusion contacted with the color resists are formed at least one undercut structure.

In the COA substrate, an area of a side of the first protrusion facing the electrically conductive layer is greater than an area of another side of the first protrusion opposite to the side facing the electrically conductive layer.

In the COA substrate, the COA substrate further comprises a plurality of pixel units, wherein each of the pixel units is provided with one of the color resists.

In the COA substrate, the COA substrate further comprises the via holes are disposed in the color resists in each of the pixel units and disposed in the planarization layer covering the color resists, and each of the first regions of the electrically conductive layer is connected to one of the TFTs through one of the via holes.

Second, the present disclosure provides a COA substrate having a first base substrate, comprising: a plurality of thin-film transistors (TFTs) disposed in an array on the first base substrate; color resists, wherein each of the color resists is correspondingly disposed on one of the TFTs; a planarization layer disposed on the color resists and covering all of the color resists; and an electrically conductive layer disposed on the planarization layer; wherein an orthogonal projection of the electrically conductive layer projecting on the planarization layer covers the planarization layer, the electrically conductive layer comprises a plurality of first regions and second regions disposed between two adjacent one of the first regions, each of the first regions is electrically connected to one of the TFTs, and the first regions and the adjacent second regions are separated.

In the COA substrate, the planarization layer is provided with a plurality of first protrusions, each first protrusion is corresponding to an area of one of the second regions.

In the COA substrate, a surface of the first protrusion contacted with the electrically conductive layer and a surface of the first protrusion contacted with the planarization layer are formed at least one undercut structure.

In the COA substrate, at least one of two adjacent one of the color resists is provided with one of a plurality of second protrusions, and the plurality of second protrusions correspond to the plurality of first protrusions.

In the COA substrate, a surface of the second protrusion contacted with the electrically conductive layer and a surface of the second protrusion contacted with the color resists are formed at least one undercut structure.

In the COA substrate, an area of a side of the first protrusion facing the electrically conductive layer is greater than an area of another side of the first protrusion opposite to the side facing the electrically conductive layer.

In the COA substrate, the COA substrate further comprises a plurality of pixel units, wherein each of the pixel units is provided with one of the color resists.

In the COA substrate, the COA substrate further comprises the via holes are disposed in the color resists in each of the pixel units and disposed in the planarization layer covering the color resists, and each of the first regions of the electrically conductive layer is connected to one of the TFTs through one of the via holes.

Third, the present disclosure provides a display panel comprising the above-mentioned COA substrate, wherein the display panel further comprises an opposite substrate and a liquid crystal layer disposed between the COA substrate and the opposite substrate, wherein the opposite substrate comprises a second base substrate and an electrode layer disposed on the second base substrate, and each of the color resists is corresponding to one of openings provided in the electrode layer.

In the display panel, the opposite substrate further comprises a plurality of black matrixes corresponding to boundaries of adjacent one of the color resists.

Beneficial Effects

In comparison with present technologies, in the COA substrate and the display panel provided by the present disclosure, the electrically conductive layer covering the planarization layer is provided on the planarization layer. The electrically conductive layer includes the plurality of first regions and second regions disposed between two adjacent first regions. Each of the first regions of the electrically conductive layer is electrically connected to a thin-film transistor. The adjacent first regions are disconnected and the second region are separated. Segmentation separation occurs at the boundary between the electrically conductive layer and the color resist, which can make the electrically conductive layer work independently in a single pixel unit without short circuiting and can effectively prevent the planarization layer from generating ion penetration into the liquid crystal layer. Thus, the problem of image sticking is improved.

DESCRIPTION OF DRAWINGS

FIG. 1A illustrates a structural diagram of a normal array substrate of existing technologies.

FIG. 1B illustrates a structural diagram of a color-filter on array substrate of existing technologies.

DETAILED DESCRIPTION OF PREFERRED EMBODIMENTS

Figure 2:
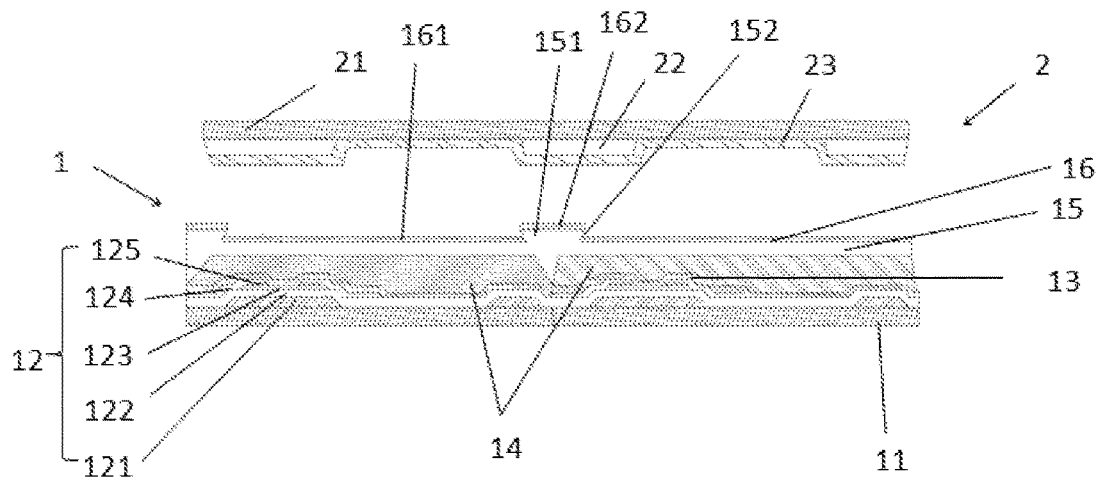
FIG. 2 illustrates a color-filter on array substrate and a display panel of a first embodiment of the present disclosure.

The present disclosure provides a color-filter on array (COA) substrate and a display device. In order to clarify the technical solutions of embodiments of the present disclosure, the present disclosure is described by the embodiments in detail accompany with drawings. Obviously, the mentioned embodiments are utilized to clarify the present discloser rather than limit the present disclosure.

Please refer to FIG. 1 which illustrates a structural diagram of a normal array substrate of existing technologies. As shown in FIG. 1A, the array substrate includes a first base substrate 11, a plurality of TFTs 12, a passivation layer 13, and a pixel electrode 16 which are subsequently stacked. The TFT 12 includes a gate 121 disposed on the first base substrate 11. A gate insulating layer 122 is disposed on the gate 121 and covers the gate 121 and the first base substrate 11. An active layer 123 is disposed on the gate insulating layer 122. An insulating layer 125 is disposed on the active layer 123 and covers the active layer 123 and the gate insulating layer 122. A source and drain 124 are disposed on the insulating layer 125. The passivation layer 13 is disposed on the plurality of TFTs 12 and covers the source and drain 124 and the insulating layer 125. The array substrate further includes scan lines disposed on the same layer as the gate electrode 121 and signal lines disposed on the same layer as the source drain 124. FIG. 1A also illustrates a color filter substrate disposed opposite to the array substrate. The color filter substrate includes a second base substrate 21, a plurality of black matrixes 22, a second electrically conductive layer 23, and a plurality of color resists 14 disposed between the second base substrate 21 and the second electrically conductive layer 23. The color resists 14 are red color resist, green color resist, and blue color resist (not shown in drawings). Each of the color resists 14 is located between two adjacent black matrixes 22. The second electrically conductive layer 23 is a common electrode. The black matrixes 22 are disposed corresponding to positions of the scan lines or the signal lines.

Please refer to FIG. 1B which illustrates a structural diagram of a color-filter on array (COA) substrate of existing technologies. The COA substrate 01 includes a first substrate base 11, a plurality of scan lines formed on the first base substrate 11, a plurality of data lines disposed perpendicular to the scan lines, and a plurality of pixel units defined by the scan lines and the data. Each of the pixel units includes: a TFT 12, a passivation layer 13 covering the TFT 12, and color resists 14 disposed on the passivation layer 13. The COA substrate 01 also includes a planarization layer 15 covering all of the color resists 14. The COA substrate 01 further includes a pixel electrode 16 disposed on the planarization layer 15 and located within the pixel units. Each of the color resists 14 of the pixel unit may be a red color resist, a green color resist, and a blue color resist (not numbered). The red color resist corresponds to red pixel units, the green color resist corresponds to green pixel units, and the blue color resist corresponds to blue pixel. The TFT 12 includes a gate 121 disposed on the same layer as the scan line, a gate insulating layer 122 disposed on the gate 121 and covering the gate 121, a semiconductor layer 123 disposed on the gate insulating layer 122, an insulating layer 125 disposed on the semiconductor layer 123 and covering the semiconductor layer 123, and a source and drain 124 disposed on the insulating layer 125 and disposed on the same layer as the signal line. FIG. 1B also shows a pair of opposite substrates 02 disposed opposite to the COA substrate 01. The opposite substrates 02 include a second base substrate 21, a plurality of black matrixes 22, and a common electrode layer 23 which are sequentially stacked. The black matrixes 22 are disposed at positions corresponding to the scan lines or the signal lines.

The difference between the COA substrate 01 shown in FIG. 1B and the conventional array substrate shown in FIG. 1A is that a plurality of the color resists 14 shown in FIG. 1B are provided on one side of the COA substrate 01, a planarization layer 15 is provided on the plurality of color resists 14, and the planarization layer 15 covers all of the color resists 14. In the COA substrate 01 shown in FIG. 1B, the pixel electrode 16 is patterned in the opening area. Different patterned pixel electrodes can be designed by using 2/4/8 domains, etc., but although the penetration improves transmittance and viewing angles of the liquid crystal, the patterned pixel electrode 16 easily lets ions penetrate the planarization layer 15 so that the resistivity of the liquid crystal layer is affected and image sticking occurs.

Please refer to FIG. 2 which illustrates a color-filter on array substrate and a display panel of a first embodiment of the present disclosure. The present disclosure discloses a COA substrate 1 having a first base substrate 11. The COA substrate 1 includes a plurality of TFTs 12 arranged in an array on the first base substrate 11. Each of the TFT 12 corresponds to a color resist 14. A planarization layer 15 is disposed on the color resist 14 and covers all of the color resists 14. An electrically conductive layer 16 is disposed on the planarization layer 15. An orthographic projection of the electrically conductive layer 16 on the planarization layer 15 covers the planarization layer 15. The electrically conductive layer 16 includes a plurality of first regions 161 and second regions 162 disposed between two adjacent first regions 161. Each of the first regions 161 is electrically connected to one of the TFTs 12. The adjacent first regions 161 and the second regions 162 are separated.

Figure 3:
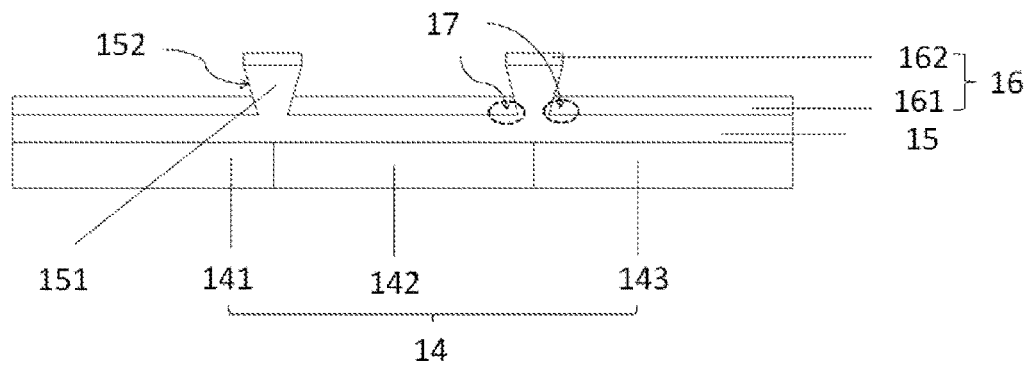
FIG. 3 illustrates a simple structural diagram of a color resist, a planarization layer, and an electrically conductive layer of the color-filter on array substrate shown in FIG. 2.

Please refer to FIG. 3 accompanying with FIG. 2. FIG. 3 illustrates a simple structural diagram of a color resist, a planarization layer, and an electrically conductive layer of the color-filter on array substrate shown in FIG. 2.

In this embodiment, the planarization layer 15 is provided with a plurality of first protrusions 151 in locations corresponding to each of the second regions 162. Each of the first protrusions 151 of the planarization layer 15 corresponds to a boundary between two adjacent color resists 14. Each of the color resists 14 may be a red color resist, a green color resist, or a blue color resist. Each of the first protrusions 151 is integrated to a structure of the planarization layer 15.

An area of a side of the first protrusion 151 facing the electrically conductive layer 16 is greater than an area of another side of the first protrusion 151 opposite to the side facing the electrically conductive layer 16. More particularly, a surface of each of the first protrusions 151 contacting the electrically conductive layer 16 and a surface of the planarization layer 15 forms at least one undercut structure 17 (taper angle). Each of the first protrusions 151 further includes at least one inclined sidewall 152. An inclined angle formed between the inclined sidewall 152 and the surface of the planarization layer 15 in the area of the undercut structure 17 is less than 90°.

Preferably, the first protrusion 151 is an inverted tapered protrusion or inverted trapezoidal protrusion. The inverted tapered protrusion or inverted trapezoidal protrusion forms a structure with a high taper angle during the manufacturing process. The planarization layer 15, the inverted tapered protrusion, or the inverted trapezoidal protrusion is made of transparent organic photoresists.

In this embodiment, in the present disclosure, a half tone mask (HTM) is used to manufacture the planarization layer 15 and the first protrusion 151 so that the first protrusion 151 has significant step differences at the boundary of any adjacent pixel units.

In this embodiment, because the first protrusion 151, the undercut structure 17, and the electrically conductive layer 16 are deposited on the planarization layer 15 and the first protrusion 151 over the entire surface. The electrically conductive layer 16 is deposited on the entire side of the planarization layer 15 and the first protrusion 151 facing away from the first base substrate 11 in the manufacturing process. As a result, the first regions 161 and the second regions 162, which are separated, are formed due to a high step difference of the electrically conductive layer 16 at each of the first protrusions 151.

In the present disclosure, as a preferred embodiment, the TFT 12 includes a gate electrode 121 disposed on the same layer as the scan lines. A gate insulation layer 122 is disposed on the gate electrode 121 and covers the gate electrode 121. A semiconductor layer 123 is disposed on the gate insulating layer 122. A passivation layer 125 is disposed on the semiconductor layer 123 and covers the semiconductor layer 123 and the gate insulating layer 122. A source and drain 124 are disposed on the passivation layer 125 and on the same layer as the signal lines. In other embodiments, the TFT 12 may also be a top gate structure, which is not specifically limited herein.

In the present disclosure embodiment, the COA substrate 1 includes a plurality of pixel units, and the orthographic projection of the scanning line and the signal lines on the first base substrate 11 defines a plurality of the pixel units. Each of the pixel units is provided with one of the color resists 14. The pixel units correspond to red pixel units, green pixel units, and blue pixel units respectively. The planarization layer 15 covers all pixel units and the color resists 14. It should be noted that via holes (not shown) are provided on the color resists 14 in each of the pixel units and the planarization layer 15 covering the color resist 14, so that the first regions 161 of the electrically conductive layer 16 are electrically connected to the source and drain 124 of the TFT 12 through the via holes.

Please refer to FIG. 2 and FIG. 3.

The difference between the COA substrate 1 in the present disclosure and the COA substrate 01 in the prior art shown in FIG. 1B is that in the COA substrate 1 described in the present disclosure embodiment, the planarization layer 15 is provided with one of the first protrusions 151 which is disposed corresponding to each one of the second regions 162. Each of the first protrusions 151 contacts a surface of the electrically conductive layer 16 and a surface of the planarization layer 15 to form the undercut structure 17 (taper angle). And the electrically conductive layer 16 is deposited on the entire surface of the planarization layer 15 and the first protrusion 151. The electrically conductive layer 16 is separated due to high steps at each of the first protrusions 151, and thereby the first regions 161 and the second regions 162 are formed. The electrically conductive layer 16 completely covers the planarization layer 15. Each of the first regions 161 of the electrically conductive layer 16 corresponds to one of the pixel units. Each of second regions 162 covers the first protrusion 151. An orthogonal projection of the electrically conductive layer 16 on the planarization layer 15 completely covers the planarization layer 15 so that the liquid crystal layer can be effectively prevented from ions permeability by the planarization layer 15. Thus, image sticking is improved. Moreover, because the first regions 161 and the second regions 162 of the electrically conductive layer 16 are disconnected one by one at the first protrusion 151, the first regions 161 can make any adjacent pixel units independently work without short circuiting.

Please refer to FIG. 2. The present disclosure also discloses a display panel including the COA substrate 1. The display panel further includes a pair of opposite substrates 2 opposite to the COA substrate 1. The COA substrate 1 is provided in the display panel. A liquid crystal layer (not shown) and an alignment film (not shown) are between the COA substrate 1 and the opposite substrate 02. The COA substrate 1 and the opposite substrate 2 form a liquid crystal box. The opposite substrates 2 include a second base substrate 21, a plurality of black matrixes 22 disposed on the second base substrate 21, and an electrode layer 23 disposed on and covering the black matrixes 22 and the second base substrate 21. The black matrixes 22 correspond to a boundary of adjacent color resists 14. The black matrixes 22 correspond to the scan lines or data lines of the TFTs 12. In order to achieve multi-domain display of the display panel, the electrode layer 23 is provided with at least one patterned opening (not shown) corresponding to each of the color resists 14.

Figure 4:
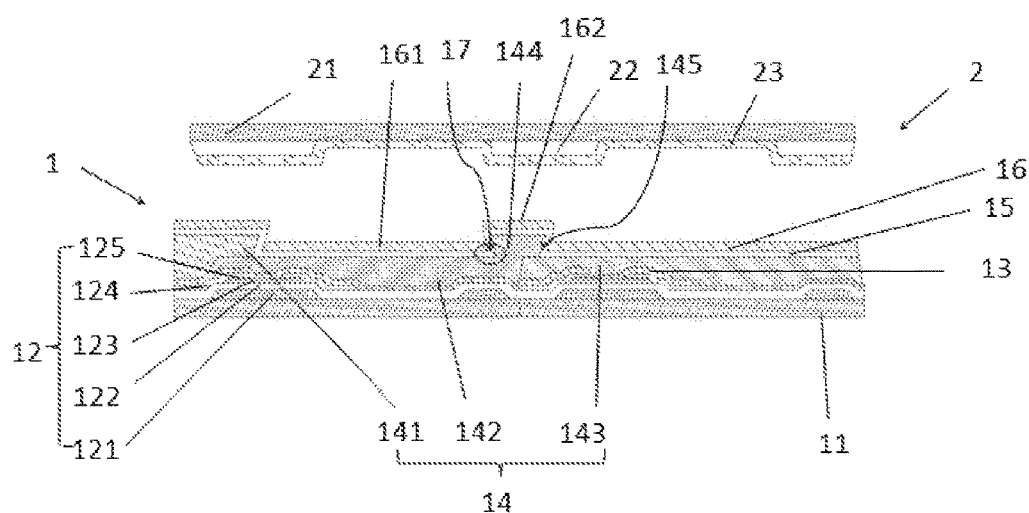
FIG. 4 illustrates a color-filter on array substrate and a display panel of a second embodiment of the present disclosure.

Please refer to FIG. 4 which illustrates a second embodiment of a COA substrate and a display panel of the present disclosure. As shown in FIG. 4, the difference between the second embodiment and the first embodiment is that the color resist 14 includes a red color resist 141, a green color resist 142, and a blue color resist 143 in the second embodiment. At least one color resist 14 of two adjacent color resists 14 is provided with a second protrusion 144 corresponding to the second regions 162. Each of the second protrusions 144 and at least one of the color resists 14 are an integrated structure. The surface of the second protrusion 144 contacting the planarization layer 15 and the surface of the color resist 14 form at least one undercut structure 17 (taper angle). Each of the second protrusions 144 further includes at least one inclined sidewall 145. The inclined angle formed between the inclined sidewall 145 and the surface of the color resist 14 in the area of the undercut structure 17 is less than 90°. And in this embodiment, the height of the planarization layer 15 is same. The planarization layer 15 covers the color resist 14 and the second protrusion 144. The electrically conductive layer 16 is deposited on the entire surface of the planarization layer 15. The electrically conductive layer 16 is separated and disconnected at the second protrusion 144 due to high step differences.

In the second embodiment of the present disclosure, the electrically conductive layer 16 and the planarization layer 15 are separated and disconnected due to high step differences at each of the second protrusion 144 because the second protrusion 144, the undercut structure 17, and the electrically conductive layer 16 are entirely deposited on the surface of the planarization layer 15, and the planarization layer 15 covers all the color resists 14 and the second protrusion 144, which leads to a naturally consequent formation of first regions 161 and the second regions 162. The orthographic projection of the electrically conductive layer 16 on the planarization layer 15 completely covers the planarization layer 15. The electrically conductive layer 16 can also prevent the of the planarization layer 15 from ion educt. The purpose of reducing the image sticking is achieved by the disconnection of the electrically conductive layer 16 at the second protrusion 144 which can also prevent short circuiting between adjacent pixel units.

In the above embodiments of the present disclosure, the electrically conductive layer 16 and the electrode layer 23 are both indium tin oxide (transparent ITO), which is not limited in other embodiments.

In the above embodiments of the present disclosure, a plurality of the TFTs 12 are disposed on the first base substrate 11, but in other embodiments, a plurality of the TFTs 12 can also be disposed on other layers. For example, a plurality of the TFTs 12 are disposed between the planarization layer 15 and the color resist 14 and they are not limited thereto.

Specific implementations of embodiments can refer to the above-mentioned embodiments, and details are not described herein again.

To conclude, the present disclosure disposes the electrically conductive layer 16 covering the planarization layer 15, disposes the plurality of first regions 161 and second regions 162 between two adjacent first regions 161 in the electrically conductive layer 16, and electrically connects each first region 161 of the electrically conductive layer 16 to one of TFTs 12. The adjacent first regions 161 and the second regions 162 are separated. The electrically conductive layer 16 has segmentation separation corresponding to the boundary between the color resists 14, which can make a single pixel unit work independently without short circuiting and can effectively prevent the planarization layer 16 from ion penetrating into the liquid crystal layer 15 because the orthographic projection of the electrically conductive layer 16 on the planarization layer 15 entirely covers the planarization layer 15. Therefore, the problem of image sticking is improved.

It should be noted that for a skilled person in the art, equivalent replacements or modifications can be obtained according to the technical solution and the aspects of the present disclosure fall into the protection of the attached claims of the present disclosure.

What is claimed is:

1. A color-filter on array (COA) substrate having a first base substrate, comprising:
    a plurality of thin-film transistors (TFTs) disposed in an array on the first base substrate;
    color resists, wherein each of the color resists is correspondingly disposed on one of the TFTs;
    a planarization layer disposed on the color resists and covering all of the color resists; and
    an electrically conductive layer disposed on the planarization layer;
    wherein an orthogonal projection of the electrically conductive layer projecting on the planarization layer covers the planarization layer;
    the electrically conductive layer comprises a plurality of first regions and second regions disposed between two adjacent first regions, each of the first regions is electrically connected to one of the TFTs, and the first regions and the adjacent second regions are separated; and
    the planarization layer is provided with a plurality of first protrusions, each first protrusion corresponds to an area of one of the second regions, the first protrusion extends away from the first base substrate and comprises a top end away from the first base substrate and a bottom end adjacent to the first base substrate, the first protrusion further comprises an undercut structure defined on two sides of the bottom end of the first protrusion, and an area of the top end of the first protrusion is greater than an area of the bottom end of the first protrusion.

2. The COA substrate according to claim 1, wherein at least one of two adjacent color resists is provided with one of a plurality of second protrusions extending away from the first base substrate, each second protrusion corresponds to each first protrusion and comprises a top end away from the first base substrate and a bottom end adjacent to the first base substrate, the second protrusion further comprises an undercut structure defined on two sides of the bottom end of the second protrusion, and an area of the top end of the second protrusion is greater than an area of the bottom end of the second protrusion.

3. The COA substrate according to claim 1 further comprises a plurality of pixel units, wherein each of the pixel units is provided with one of the color resists.

4. A display panel comprising the COA substrate according to claim 1, wherein the display panel further comprises an opposite substrate and a liquid crystal layer disposed between the COA substrate and the opposite substrate, wherein the opposite substrate comprises a second base substrate and an electrode layer disposed on the second base substrate, and each of the color resists is corresponding to one of openings provided in the electrode layer.

5. The display panel according to claim 4, wherein the opposite substrate further comprises a plurality of black matrixes corresponding to boundaries of adjacent color resists.

\* \* \* \* \*